(12) United States Patent
Huang et al.

(10) Patent No.: US 12,264,981 B2
(45) Date of Patent: Apr. 1, 2025

(54) PRESSURE SENSING DEVICE AND PRESSURE SENSING APPARATUS

(71) Applicant: SHENZHEN NEW DEGREE TECHNOLOGY CO., LTD., Guangdong (CN)

(72) Inventors: Tuoxia Huang, Guangdong (CN); Jinbo Yu, Guangdong (CN)

(73) Assignee: SHENZHEN NEW DEGREE TECHNOLOGY CO., LTD., Shenzhen (CN)

( * ) Notice: Subject to any disclaimer, the term of this patent is extended or adjusted under 35 U.S.C. 154(b) by 423 days.

(21) Appl. No.: 17/912,838

(22) PCT Filed: Feb. 8, 2021

(86) PCT No.: PCT/CN2021/075916
§ 371 (c)(1),
(2) Date: Sep. 19, 2022

(87) PCT Pub. No.: WO2021/185004
PCT Pub. Date: Sep. 23, 2021

(65) Prior Publication Data
US 2023/0146214 A1     May 11, 2023

Related U.S. Application Data

(60) Provisional application No. 63/064,086, filed on Aug. 11, 2020, provisional application No. 62/992,000, filed on Mar. 19, 2020.

(51) Int. Cl.
*G01L 1/22*     (2006.01)
*G01L 1/14*     (2006.01)
(Continued)

(52) U.S. Cl.
CPC ............ *G01L 1/2293* (2013.01); *G01L 1/148* (2013.01); *G01L 1/2262* (2013.01);
(Continued)

(58) Field of Classification Search
CPC ..... G01L 1/2293; G01L 1/148; G01L 1/2262; G01L 1/2281; G01L 1/18; H01L 28/20;
(Continued)

(56) References Cited

U.S. PATENT DOCUMENTS 4,556,115 A    12/1985   Lockery et al.
4,771,638 A     9/1988   Sugiyama et al.
(Continued)

FOREIGN PATENT DOCUMENTS

CN         1049718 A     3/1991
CN         1460846 A    12/2003
(Continued)

OTHER PUBLICATIONS

International Search Report for PCT/CN2021/075916 dated Apr. 25, 2021, 4 pages.
(Continued)

*Primary Examiner* — Brandi N Hopkins
(74) *Attorney, Agent, or Firm* — NIXON & VANDERHYE, P.C.

(57) ABSTRACT

The present application relates to a pressure sensing device and a pressure sensing apparatus. The pressure sensing device (20) includes: one or more pressure sensing sheet (10), and a first substrate (22) configured for carrying the pressure sensing sheet (10); the pressure sensing sheet (10) is connected with the first substrate (22) by welding, and welding points are configured for transmitting a deformation and transmitting an electrical signal, and the pressure sensing sheet includes at least one semiconductor film (12), and a signal measurement circuit is integrated in the at least one
(Continued)

semiconductor film (12), and the signal measurement circuit is configured for detecting an amount of the deformation and outputting the electrical signal that is able to be identified. Integrating the signal detection circuit in the semiconductor film (12) is greatly reduce the volume of the structure, which is beneficial to improve the integration degree of the product, and is beneficial to the miniaturization of the product.

20 Claims, 5 Drawing Sheets

(51) Int. Cl.
*G01L 1/18* (2006.01)
*H01L 29/8605* (2006.01)
*H01L 49/02* (2006.01)
*G06F 3/041* (2006.01)

(52) U.S. Cl.
CPC ............ *G01L 1/2281* (2013.01); *H01L 28/20* (2013.01); *H01L 29/8605* (2013.01); *G01L 1/18* (2013.01); *G06F 3/041* (2013.01); *G06F 2203/04105* (2013.01)

(58) Field of Classification Search
CPC ................ H01L 29/8605; G06F 3/041; G06F 2203/04105
See application file for complete search history.

(56) References Cited

U.S. PATENT DOCUMENTS

| | | | |
|---|---|---|---|
| 7,474,171 B2* | 1/2009 | Morris | B81B 3/0086 333/101 |
| 2010/0307255 A1 | 12/2010 | Totokawa et al. | |
| 2015/0068315 A1 | 3/2015 | Davis et al. | |
| 2016/0377497 A1* | 12/2016 | Nackaerts | B81C 1/00246 73/862.626 |

FOREIGN PATENT DOCUMENTS

| | | | |
|---|---|---|---|
| CN | 101044382 A | 9/2007 | |
| CN | 101046368 A | 10/2007 | |
| CN | 201215517 Y | 4/2009 | |
| CN | 101526411 | 9/2009 | |
| CN | 101566514 A | 10/2009 | |
| CN | 101639391 A | 2/2010 | |
| CN | 101719482 | 6/2010 | |
| CN | 101807531 A | 8/2010 | |
| CN | 101815933 A | 8/2010 | |
| CN | 202255734 U | 5/2012 | |
| CN | 202710236 U | 1/2013 | |
| CN | 103712721 A | 4/2014 | |
| CN | 104897333 A | 9/2015 | |
| CN | 204652340 U | 9/2015 | |
| CN | 105021341 A | 11/2015 | |
| CN | 105021347 A | 11/2015 | |
| CN | 105203019 A | 12/2015 | |
| CN | 105224129 A | 1/2016 | |
| CN | 105895540 A | 8/2016 | |
| CN | 105895587 A | 8/2016 | |
| CN | 205843877 U | 12/2016 | |
| CN | 106301324 A | 1/2017 | |
| CN | 106768524 A | 5/2017 | |
| CN | 106855756 A | 6/2017 | |
| CN | 206930343 U | 1/2018 | |
| CN | 108027290 A | 5/2018 | |
| CN | 108037844 A | 5/2018 | |
| CN | 108365021 A | 8/2018 | |
| CN | 207964135 U | 10/2018 | |
| CN | 108917587 A | 11/2018 | |
| CN | 109238525 | 1/2019 | |
| CN | 109399556 A | 3/2019 | |
| CN | 109781314 A | 5/2019 | |
| CN | 109844447 A | 6/2019 | |
| CN | 110174198 A | 8/2019 | |
| CN | 209264161 A | 8/2019 | |
| CN | 110806172 A | 2/2020 | |
| CN | 111174687 A | 5/2020 | |
| EP | 0195232 A2 | 9/1986 | |
| JP | 2017003365 A | 9/1986 | |
| JP | H06302835 | 10/1994 | |
| JP | 2007263781 A | 10/2007 | |
| JP | 2007281051 A | 10/2007 | |
| JP | 61-214582 A | 11/2015 | |
| WO | 2015038320 | 3/2015 | |
| WO | 2017133016 A1 | 8/2017 | |
| WO | WO-2017133017 A1 * | 8/2017 | ............... G01L 1/18 |
| WO | 2018133054 A1 | 7/2018 | |
| WO | 2018231808 A1 | 12/2018 | |
| WO | 2019014866 | 1/2019 | |
| WO | 2019160349 A1 | 8/2019 | |

OTHER PUBLICATIONS

Written Opinion of the ISA for PCT/CN2021/075916 dated Apr. 25, 2021, 3 pages.
Office Action issued in CN202180018343.9, dated Mar. 7, 2024, 7 pages.
Office Action issued in CN202180018123.6, dated Jun. 28, 2024, 10 pages.

* cited by examiner

PRESSURE SENSING DEVICE AND PRESSURE SENSING APPARATUS

CROSS REFERENCE TO RELATED APPLICATIONS

This application is a National Stage Application of International Patent Application No. PCT/CN2021/075916, with an international filing date of Feb. 8, 2021, which is based on a US provisional patent application, with Application No. 62/992,000, filed on Mar. 19, 2020, and a US provisional patent application, with Application No. 63/064,086, filed on Aug. 11, 2020. The contents of all of the aforementioned applications, including any intervening amendments thereto, are incorporated herein by reference.

TECHNICAL FIELD

The present application relates to the technical field of sensors, and more particularly to a pressure sensing device and a pressure sensing apparatus.

BACKGROUND

The strain-type pressure-sensitive sensor is formed by pasting a strain gauge on an elastomer of the sensor, the strain-type pressure-sensitive sensor can be such as weighing, acceleration and pressure sensors. The performance of the strain gauge directly determines the performance of this type of sensor.

The solutions of the existing pressure-resistance keys, such as a bridge-type support structure, have the problems that the existing pressure-sensitive keys need to be customized according to the structures thereof, and a fingerprint pressure key needs foam and structural support, the existing pressure-sensitive keys have large sizes and it is not conducive to miniaturization, the versatility is poor, and highly dependent on panel structure is required.

SUMMARY

One of the objects of an embodiment of the present application is to provide a pressure sensing device, to solve the technical problem that the pressure-resistance key solutions in the art need to be customized, the large size is not conducive to miniaturization, and the versatility is poor.

In order to solve the above-mentioned technical problem, the technical solutions adopted in embodiments of the present application are:

In a first aspect, a pressure sensing device is provided, and the pressure sensing device includes: at least one pressure sensing sheet, and a first substrate, configured for carrying the at least one pressure sensing sheet; the pressure sensing sheet is connected with the first substrate by welding, and welding points are configured for transmitting a deformation and transmitting an electrical signal, and the at least one pressure sensing sheet includes: a second substrate, provided with an upper surface and a lower surface opposite to the upper surface; at least one semiconductor film, fixed on the lower surface and/or the upper surface of the second substrate, wherein a signal measurement circuit is integrated in the at least one semiconductor film, and the signal measurement circuit is configured for detecting an amount of the deformation and outputting the electrical signal that is able to be identified; and a plurality of bonding pads, configured to be welded with the first substrate, wherein the bonding pads are arranged at the upper surface of the second substrate, and are electrically connected to the semiconductor film.

In a second aspect, a pressure sensing apparatus is provided, and the pressure sensing apparatus includes a control panel and the above-mentioned pressure sensing device, and the pressure sensing device is pasted at an inner surface of the control panel, and the pressure sensing device deforms following of the control panel.

In a third aspect, a pressure sensing apparatus is provided, and the pressure sensing apparatus includes a control panel and a control circuit board pasted at an inner surface of the control panel and configured for controlling the control panel, and further includes the above-mentioned pressure sensing device, and the first substrate of the pressure sensing device is the control panel control circuit board, and the second substrate of the pressure sensing device deforms following the control circuit board of the control panel.

The strain sensing device/apparatus of the present application can be disposed on any apparatus through the substrate. When the pressure sensing device/apparatus is deformed, the deformation is transmitted to the pressure sensing sheet through the welding pad, which does not require a custom structure and the versatility is better; in addition, the signal detection circuit is integrated in the semiconductor film, which can greatly reduce the volume of the structure, which is beneficial to improve the integration degree of the product, and is beneficial to the miniaturization of the product.

BRIEF DESCRIPTION OF THE DRAWINGS

In order to illustrate the technical solutions in the embodiments of the present application more clearly, the following briefly introduces the accompanying drawings that are used in the description of the embodiments or exemplary technologies. Obviously, the drawings in the following description are only some embodiments of the present application, for those skilled in the art, other drawings can also be obtained according to these drawings without any creative effort.

DETAILED DESCRIPTION OF EMBODIMENTS

Figure 1:
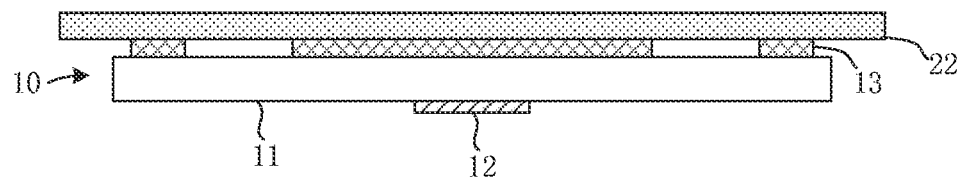
FIG. 1 is a schematic structural diagram of a pressure sensing device provided in Embodiment 1 of the present application.

In order to make the technical problem, the technical solution and the advantages of the present application be clearer and more understandable, the present application will be further described in detail below with reference to accompanying figures and embodiments. It should be understood that the specific embodiments described herein are merely intended to illustrate but not to limit the present application.

It is noted that when a component is referred to as being "fixed to" or "disposed on" another component, it can be directly or indirectly on another component. When a component is referred to as being "connected to" another component, it can be directly or indirectly connected to another component. In the description of the present application, it needs to be understood that, directions or location relationships indicated by terms such as "up", "down", "left", "right", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application. In addition, terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s), in the description of the present application, "a plurality of" means two or more, unless there is additional explicit and specific limitation.

The temperature coefficient of resistance (TCR) represents the relative change of the resistance value of a resistor when the temperature changes by 1° C., and the unit is ppm/° C. (that is, $10^{-6}$/° C.). The gauge factor (GF) of the resistance strain gauge represents the relative change of the strain gauge resistance caused by the unit strain of the resistance strain gauge, in the embodiment:

$$GF = \frac{dR/R}{\varepsilon},$$

dR/R is a resistance change rate, ε is a mechanical strain of a material; the effective gauge factor (GF_eff) is a ratio of the actual resistance change to the ideal strain assuming that the semiconductor film has no effect on the structural strength. For a specific structure, when the external force is given, the deformation of the structure is determined. However, after a semiconductor film with a larger elastic modulus such as silicon (Si) is pasted, the deformation of Si is generally smaller than the deformation of the carrier structure, and as the film thickness increases, the strain deformation at the film becomes smaller, and the corresponding resistance change decreases, that is, the effective GF decreases with the increase of the thickness of the film.

Embodiment 1

Referring to FIG. 1, in an embodiment, the pressure sensing device 20 includes at least one pressure sensing sheet 10 and a first substrate 22 carrying the pressure sensing sheets 10, and the pressure sensing sheets 10 and the first substrate 22 are connected by means of welding, specifically, the welding can be by means of Surface Mount Technology (SMT), and the welding points are configured for transmitting a deformation and transmitting an electrical signal. The pressure sensing sheet 10 includes: a second substrate 11, at least one semiconductor film 12 and a plurality of bonding pads 13 for welding with the first substrate 22. The second substrate 11 is provided with an upper surface and a lower surface opposite to the upper surface; the semiconductor film 12 is fixed on the lower surface and/or the upper surface of the second substrate 11, and at least one semiconductor film 12 is integrated therein with a signal measurement circuit, and the signal measurement circuit is used to detect the deformation amount of the deformation to output an electrical signal that can be identified; the plurality of bonding pads 13 are disposed at the upper surface of the second substrate 11 and are electrically connected to the semiconductor film 12.

In an embodiment, the semiconductor film 12 is single-sided or double-sided printed on the second substrate 11 by pasting or printing, and the pressure sensing sheet 10 is welded to the first substrate 22 by a welding process, and the semiconductor film 12 senses the sensing curvature change through the bonding pads 13 and electrical signal transmission.

In the embodiment, the first substrate 22 is a Flexible Printed Circuit (FPC), a Printed Circuit Board (PCB), a metal substrate, or a ceramic substrate. The pressure sensing sheet 10 is of a resistive type, a capacitive type, or an inductive type.

Figure 2:
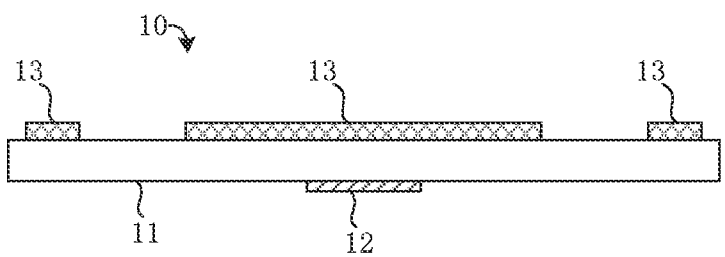
FIG. 2 is a schematic structural diagram of a first pressure sensing sheet in the pressure sensing device shown in FIG. 1.
Figure 3:
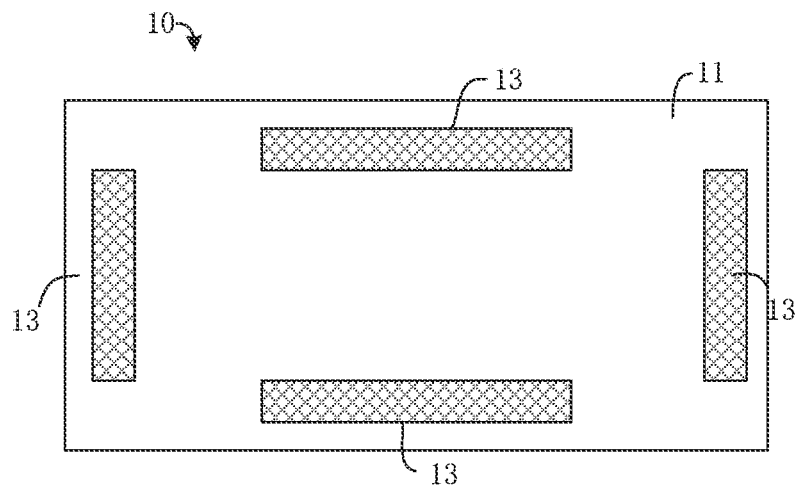
FIG. 3 is a top view of the pressure sensing sheet shown in FIG. 2.

Referring to FIGS. 1 to 3, the semiconductor film 12 is disposed at the middle of the surface of the substrate 11, and the bonding pads 13 are surrounded by the semiconductor film 12.

In one embodiment, the second substrate 11 is a glass plate, a ceramic plate, a PCB board, an aluminum substrate or a silicon wafer, and the semiconductor film 12 is disposed on the second substrate 11 by pasting or printing. The semiconductor film 12 is integrated with a signal detection circuit, and the signal detection circuit includes a sensing component, an amplification circuit, a compensation circuit, and the like, and the sensing component includes a strain sensing resistor, a temperature detection element, and the like.

Referring to FIGS. 2 and 3, a semiconductor film 12 is disposed on a pressure sensing sheet 10, which can be disposed on the upper surface or the lower surface of the second substrate 11 (in the illustrated example, the semiconductor film 12 is disposed on the lower surface), and the bonding pads 13 can be provided with two as input and output terminals of the semiconductor film 12, respectively, in other embodiments, the bonding pads 13 can be provided with four.

Figure 4:
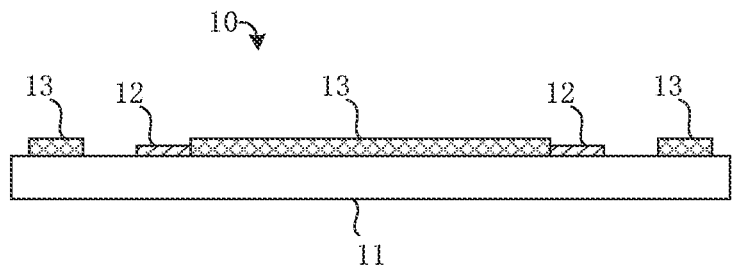
FIG. 4 is a schematic structural diagram of a second pressure sensing sheet provided Embodiment 1 of the present application.
Figure 5:
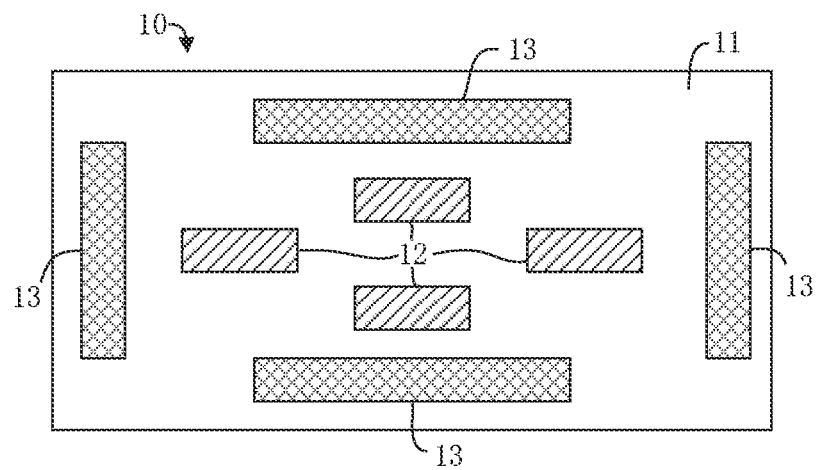
FIG. 5 is a top view of the pressure sensing sheet shown in FIG. 4.
Figure 6:
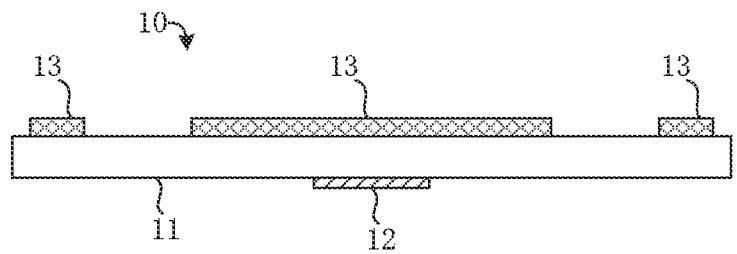
FIG. 6 is a schematic structural diagram of a third pressure sensing sheet provided in Embodiment 3 of the present application.
Figure 7:
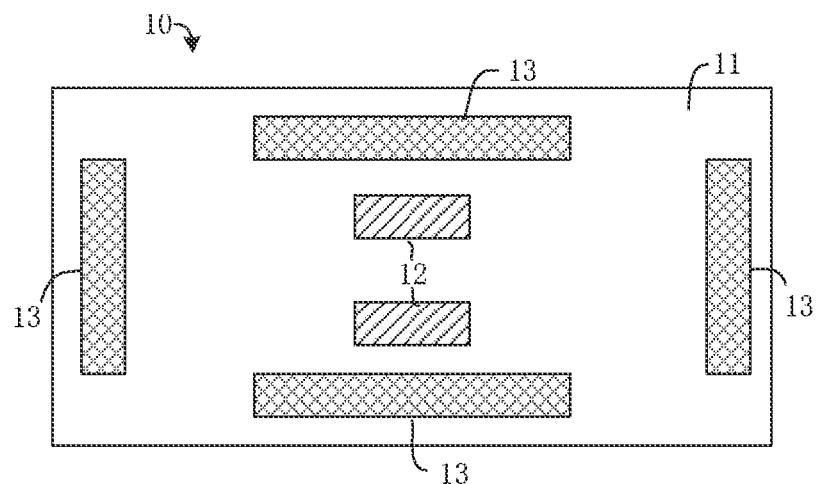
FIG. 7 is a top view of the pressure sensing sheet shown in FIG. 6.

Referring to FIG. 4 and FIG. 5, in another embodiment, four semiconductor films 12 can be disposed on the upper surface or the lower surface of the second substrate 11 at the same time. In other embodiments, please refer to FIG. 6 and FIG. 7, two of the four semiconductor films 12 can be disposed on the upper surface of the second substrate 11, and the other two of the four semiconductor films 12 can be disposed on the lower surface of the second substrate 11. In the embodiment, the number of semiconductor films 12 is provided with at least two, and at least one semiconductor film 12 is disposed on the lower surface of the second substrate 11, and the other semiconductor films 12 are disposed on the upper surface of the second substrate 11, and the semiconductor films 12 are distributed to be adjacent to each other.

The semiconductor film 12 includes at least one selected from the group consisting of a silicon (Si) film, a germanium (Ge) film, a gallium arsenide (GaAs) film, a gallium nitride (GaN) film, a silicon carbide (SiC) film, a zinc sulfide (ZnS) film, a zinc oxide (ZnO) film, and any combination thereof. In the embodiment, for example, the silicon film, the silicon film has a high strain coefficient, but the hardness is too large, and the signal output is greatly reduced when the force or strain is transmitted to the silicon film. Thinning the silicon film can reduce the rigidity, the responsiveness to force or strain is increased, and allow the semiconductor film 12 to be directly pasted to material surfaces such as printed circuit boards or flexible circuit boards for force or strain measurements. The thickness (n) of the semiconductor film 12 is n<70 μm, or n<50 μm, or n<30 μm, or n<25 μm, or n<20 μm, or n<15 μm, or n<10 μm.

In some embodiments, the sensing component includes a strain sensing resistor, and a measurement circuit of a single resistor, the measurement circuit can measure the resistance value of a single resistor as a signal output, such as, the ohmmeter being used to measure resistance, the voltammetry being used to measure resistance, the RC circuit being used to measure resistance, the RC oscillator circuit being used to measure resistance, the RLC parallel resonant circuit being used to measure resistance, etc., as required. Ohmmeter resistance measurement and voltammetry resistance measurement are methods of directly measuring resistance, and the corresponding resistance measurement circuit belongs to the conventional technology.

Figure 8:
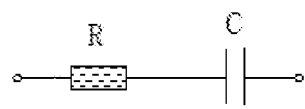
FIG. 8 is a schematic diagram of a signal measurement circuit applied in the pressure sensing device of FIGS. 1 to 7.
Figure 8:
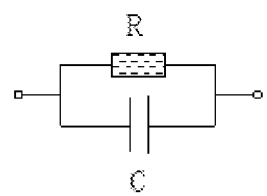

The signal measurement circuit is designed as follows:

1. Referring to FIG. 8, the signal measurement circuit includes: an RC circuit composed of a strain sensing resistor R and a constant capacitor C connected in series or connected in parallel. Using the RC circuit to measure the resistance, the time constant of the RC circuit is: r=RC. According to the above formula, if the capacitance C of the capacitor is known, the resistance value R can be inversely calculated through the measured time constant r.

Figure 9:
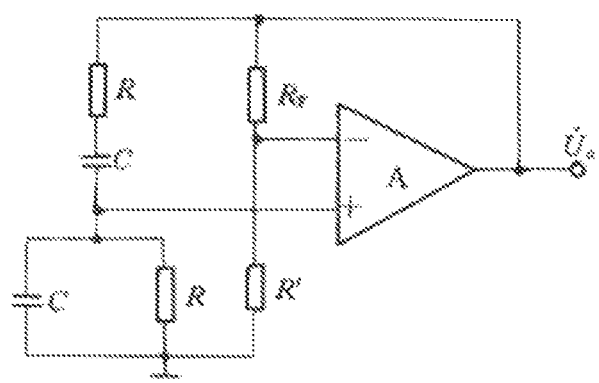
FIG. 9 is the schematic diagram of the signal measuring circuit applied in the pressure sensing device of FIG. 1.

2. Referring to FIG. 9, the signal measurement circuit includes: a strain sensing resistor R, a constant capacitor C, and an amplifier, the RC series-parallel frequency selection network and amplifier are combined, and the amplifier can use an integrated operational amplifier. The RC series-parallel frequency selection network is connected between the output terminal and the non-inverting input terminal of the operational amplifier to form a positive feedback, and $R_F$ and R' are connected between the output terminal and the inverting input terminal of the operational amplifier to form a negative feedback. The positive feedback circuit and the negative feedback circuit form a Venturi bridge oscillation circuit, and the input terminal and the output terminal of the operational amplifier are respectively connected across the two diagonal lines of the bridge. The output frequency of the Venturi bridge oscillation circuit is:

$$f_0 = \frac{1}{2\pi RC_1}$$

The frequency $f_0$ is very sensitive to the change of the resistance value R of the resistor. According to the above formula, if the capacitance $C_1$ of the capacitor is known, the resistance value R of the resistance can be inversely calculated by the measured frequency $f_0$.

Figure 10:
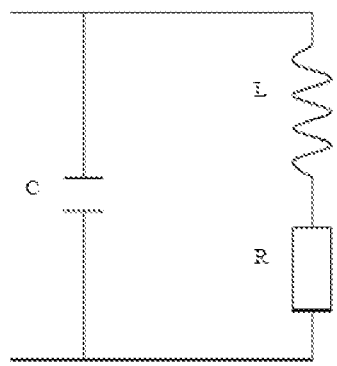
FIG. 10 is a schematic diagram of a signal measurement circuit applied in the pressure sensing device of FIG. 1.

③ Referring to FIG. 10, the signal measurement circuit includes: a strain sensing resistor R, a constant value inductance L, and a constant capacitor $C_1$ to form an RLC resonant circuit, and the RLC resonant circuit is a circuit in which the RL series circuit and the capacitor $C_1$ are connected in parallel. The angular frequency of the RLC resonant circuit is:

$$\omega = \sqrt{\frac{1}{LC} - \left(\frac{R}{L}\right)}$$

According to the above formula, if the inductance amount L of the inductance and the capacitance C of the capacitor are known, the resistance value R of the resistor can be inversely calculated through the measured angular frequency m.

The sensing component includes two resistors, such as a bleeder circuit formed by a strain sensing resistor and a reference resistor connected in series; or a bleeder circuit formed by two strain sensing resistors connected in series; or a shunt circuit formed by a strain sensing resistor and a reference resistor connected in parallel; or a shunt circuit formed by connecting two strain sensing resistors connected in parallel.

In one embodiment, when the signal measurement circuit includes: a series bleeder circuit or a parallel shunt circuit composed of two strain sensing resistors, one of the strain sensing resistors is a positive strain factor sensing resistor, and the other is a negative strain factor sensing resistor; or two strain sensing resistors have different strain factors.

The signal measurement circuit is designed as follows:

Referring to FIG. 10, two resistors are composed of a series bleeder circuit, a constant voltage source is used, and an input voltage $U_i$ is applied to both of V+ terminal and V− terminal, the potential at Vo is detected, or the output voltage $U_o$ between $V_o$ and ground is measured, and an input and output voltage formula:

$$U_o = \frac{R_2}{R_1 + R_2} U_i.$$

Figure 11:
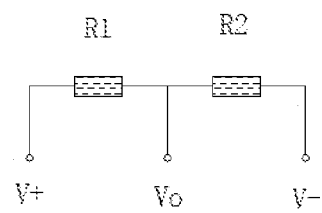
FIG. 11 is a schematic diagram of a signal measurement circuit applied in the pressure sensing device of FIG. 1.

Referring to FIG. 11, two resistors are composed of a parallel shunt circuit, a constant current source is used, the input current I is applied to both of I+ terminal and I− terminal, and the output current $I_1$ on the $R_1$ branch is measured, and an input and output current formula:

$$I_1 = \frac{R_2}{R_1 + R_2} I;$$

in which, $R_1$ is the resistance of the resistor R1, and $R_2$ is the resistance of the resistor R2.

Figure 12:
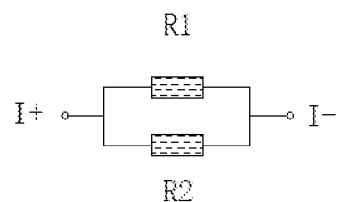
FIG. 12 is a schematic diagram of a signal measurement circuit applied in the pressure sensing device of FIG. 1.

Referring to FIG. 12, the sensing component includes four resistors R1, R2, R3 and R4, which can be a Wheatstone bridge in which a strain sensing resistor is electrically connected with three reference resistors; or includes a half-bridge circuit formed by electrically connecting two strain sensing resistors and two reference resistors; or includes a full-bridge circuit formed by electrically connecting four strain sensing resistors; or includes a bridge circuit formed by electrically connecting three strain sensing resistors and a reference resistor.

In an embodiment, in a bridge circuit composed of four strain sensing resistors, two of the strain sensing resistors are positive strain factor sensing resistors, and the other two are negative strain factor sensing resistors; or the four resistors have different strain factors.

The signal measurement circuit is designed as follows:

The bridge circuit is composed of four resistors, as shown in FIG. 12, the output voltage formula is:

$$U_o = \frac{R_2R_3 - R_1R_4}{(R_1 + R_2)(R_3 + R_4)} U_i$$

$U_i$ is the Vcc voltage, $U_o$ is the voltage difference between Vm+ and Vm−, and $R_3$ is the resistance of the resistor R3, and $R_4$ is the resistance of the resistor R4. In addition, in the full bridge circuit formed by electrically connecting the four strain sensing resistors, the ways to select the four strain sensing resistors are multiple, as long as the changing of $U_o$ in the above formula is satisfied when the deformation occurs. A few typical ways:

R1 and R4 are positive strain factor sensing resistors, R2 and R3 are negative strain factor sensing resistors; or R1 and R4 are negative strain factor sensing resistors, R2 and R3 are positive strain factor sensing resistors; or R1 and R4 are positive (or negative) strain factor sensing resistors, R2 and R3 are zero strain factor sensing resistors.

In an embodiment, the semiconductor film 12 is further provided with a temperature detection element; the sensing component further includes a temperature detection element, and the temperature detection element is configured for detecting a temperature where the temperature detection element is located and outputting a temperature detection signal. The temperature detection element can be used to measure the local temperature, and the temperature information can also be used to compensate the output signal for the structural expansion caused by the temperature, which makes the mechanical measurement more accurate. Moreover, when the temperature detection element is provided, the local temperature signal can also be detected, and the temperature information of the required measurement position can be calculated in combination with the rule of heat conduction.

In an embodiment, the signal measurement circuit further includes an amplification circuit connected to the sensing component and configured for amplifying a signal output by the sensing component. In an embodiment, the signal measurement circuit further includes a compensation circuit, and the input terminal of the compensation circuit is coupled with the output terminal of the amplification circuit, and the compensation circuit is configured for compensating an out-of-balance voltage output from the sensing component according to a signal output by the amplification circuit.

Referring to FIG. 1, the pressure sensing sheets 10 can be disposed on any pressure sensing device 20 having the second substrate 11 through the bonding pads 13, and the second substrate 11 can be a carrier board or a circuit board of the device. When the second substrate 11 of the pressure sensing device 20 is deformed, the deformation is transmitted to the pressure sensing sheet 10 through the bonding pads 13, and the electrical parameters of the semiconductor film 12 of the pressure sensing sheet 10 change, so that the output signal of the pressure sensing sheet 10 changes. The customized structure is not required, and the versatility is better. In addition, integrating the signal detection circuit in the semiconductor film 12 is greatly reduce the structure volume, which is beneficial to improve the integration degree of the product, and is beneficial to the miniaturization of the product.

Embodiment 2

Figure 13:
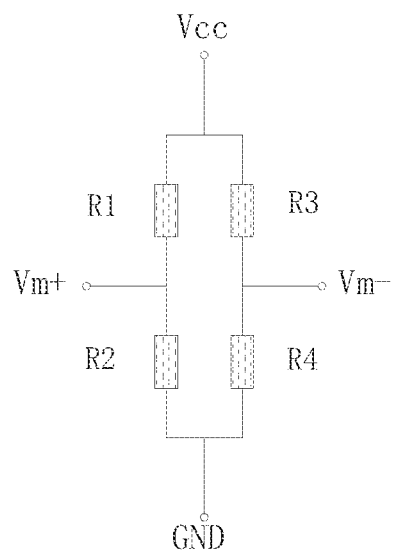
FIG. 13 is a schematic diagram of a signal measurement circuit applied in the pressure sensing device of FIG. 1.
Figure 14:
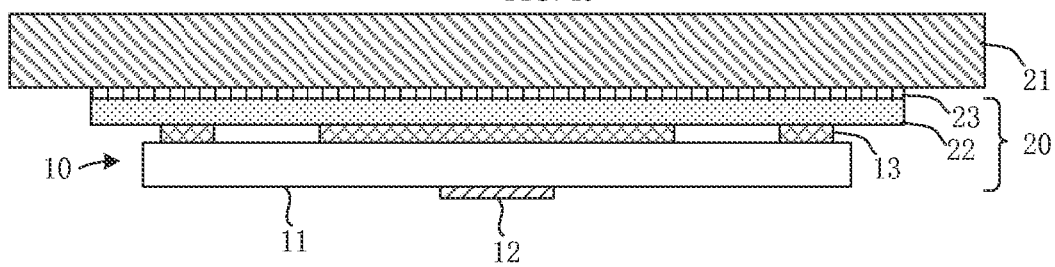
FIG. 14 is a schematic structural diagram of a pressure sensing apparatus provided by an embodiment of the present application.
Figure 15:
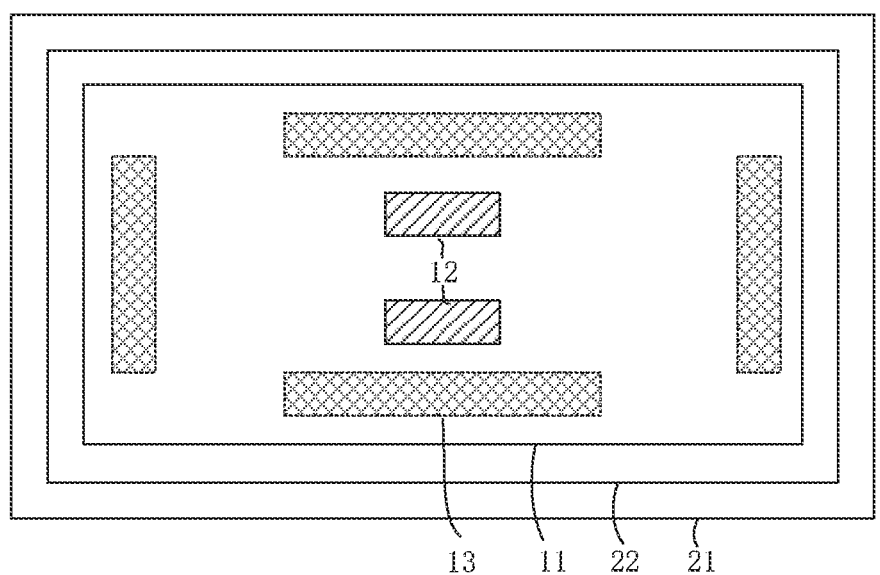
FIG. 15 is a top view of the pressure sensing apparatus shown in FIG. 14.

In addition, referring to FIG. 13 and FIG. 14, a pressure sensing apparatus is further disclosed. The pressure sensing apparatus is provided with a control panel 21 and the above-mentioned pressure sensing device 20. The pressure sensing device 20 is pasted on the inner surface of the control panel 21, and the pressure sensing device 20 deforms following of the control panel 21.

Embodiment 3

In addition, referring to FIG. 13 and FIG. 14, another pressure sensing apparatus is disclosed. The pressure sensing apparatus is provided with a control panel 21, a control circuit board pasted on the inner surface of the control panel 21 and configured for controlling the control panel 21, and the above-mentioned pressure sensing device 20. The first substrate 22 of the pressure sensing device 20 is the control circuit board, and the second substrate 11 of the pressure sensing device 20 deforms following the control circuit board.

During the specific use of the pressure sensing apparatuses provided in the second and third embodiments above, the customer designs the control circuit board 22 (that is, the first substrate) according to the shape of the control panel 21, then the pressure sensing sheets 10 are welded onto the control circuit board 22 through the bonding pads 13. Then the control circuit board 22 is pasted onto the control panel 21 by adhesives such as double-sided tape 23. The principle is as follows, the control panel 21 deforms after being subjected to external pressure, and the deformation is transmitted to the control circuit board 22 of the customer control panel through the double-sided tape, and then transmitted to the second substrate 11 of the pressure sensing sheets 10 through the bonding pads 13. Thereby, the resistance value, capacitance value or inductance value of the semiconductor film 12 on the second substrate 11 are changed.

The soldering tin and the sensor substrate can amplify the deformation on the control circuit board 22, that is, the curvature of the second substrate 11 of the pressure sensing sheet 10 is greater than the curvature of the substrate of the control circuit board 22, so that the signal of the double-sided arrangement scheme of the semiconductor thin film 12 is amplified. Referring to FIG. 10 and FIG. 11, after finite element simulation, the simulation has found that the curvature of the second substrate 11 of the pressure sensing sheet 10 is 20% to 100% larger than the curvature of the substrate of the control circuit board 22.

The above descriptions are only embodiments of the present application and are not intended to limit the present application. Any modifications, equivalent replacements and improvements made within the principles of the present application shall be included within the protection scope of the present application.

What is claimed is:

1. A pressure sensing device, comprising:
   at least one pressure sensing sheet, and
   a first substrate, configured for carrying the at least one pressure sensing sheet;
   wherein the pressure sensing sheet is connected with the first substrate by welding, and welding points are configured for transmitting a deformation and transmitting an electrical signal, and the at least one pressure sensing sheet comprises:
   a second substrate, provided with an upper surface and a lower surface opposite to the upper surface;
   at least one semiconductor film, fixed on the lower surface and/or the upper surface of the second substrate, wherein a signal measurement circuit is integrated in the at least one semiconductor film, and the signal measurement circuit is configured for detecting an amount of the deformation and outputting the electrical signal that is able to be identified; and
   a plurality of bonding pads, configured to be welded with the first substrate, wherein the bonding pads are arranged at the upper surface of the second substrate, and are electrically connected to the semiconductor film.

2. The pressure sensing device according to claim 1, wherein the semiconductor film comprises at least one selected from the group consisting of a silicon film, a germanium film, a gallium arsenide film, a gallium nitride film, and a silicon carbide film, a zinc sulfide film, a zinc oxide film, and any combination thereof.

3. The pressure sensing device according to claim 1, wherein a thickness of the semiconductor film is n<70 μm, or n<50 μm, or n<30 μm, or n<25 μm, or n<20 μm, or n<15 μm, or n<10 μm.

4. The pressure sensing device according to claim 1, wherein the first substrate is a flexible printed circuit, a printed circuit board, a metal substrate or a ceramic substrate.

5. The pressure sensing device according to claim 1, wherein the plurality of bonding pads are arranged along a periphery of the upper surface of the second substrate.

6. The pressure sensing device according to claim 1, wherein the second substrate is a glass plate, a ceramic plate, a PCB board, an aluminum substrate, or a silicon wafer.

7. The pressure sensing device according to claim 6, wherein the signal measurement circuit comprises sensing components; and
   one of the sensing components comprises a strain sensing resistor;
   one of the sensing components comprises an RC circuit composed of a strain sensing resistor and a constant capacitor connected in series or connected in parallel;
   one of the sensing components comprises a resonant circuit composed of a strain sensing resistor, a constant value inductance, and a constant capacitor;
   one of the sensing components comprises a bleeder circuit formed by a strain sensing resistor and a reference resistor connected in series;
   one of the sensing components comprises a bleeder circuit formed by connecting two strain sensing resistors connected in series;
   one of the sensing components comprises a shunt circuit formed by a strain sensing resistor and a reference resistor connected in parallel;
   one of the sensing components comprises a shunt circuit formed by connecting two strain sensing resistors connected in parallel;
   one of the sensing components comprises a Wheatstone bridge formed by electrically connecting a strain sensing resistor with three reference resistors;
   one of the sensing components comprises a half-bridge circuit formed by electrically connecting two strain sensing resistors with two reference resistors;
   one of the sensing components comprises a full-bridge circuit formed by electrically connecting four strain sensing resistors; or
   one of the sensing components comprises a bridge circuit formed by electrically connecting three strain sensing resistors with a reference resistor.

8. The pressure sensing device according to claim 1, wherein at least two semiconductor films are provided, and at least one of the semiconductor films is disposed at the lower surface of the second substrate, and the other semiconductor films are disposed at the upper surface of the second substrate, and the semiconductor films are distributed to be adjacent to each other.

9. The pressure sensing device according to claim 1, wherein the signal measurement circuit comprises sensing components; and
   one of the sensing components comprises a strain sensing resistor;
   one of the sensing components comprises an RC circuit composed of a strain sensing resistor and a constant capacitor connected in series or connected in parallel;
   one of the sensing components comprises a resonant circuit composed of a strain sensing resistor, a constant value inductance, and a constant capacitor;
   one of the sensing components comprises a bleeder circuit formed by a strain sensing resistor and a reference resistor connected in series;
   one of the sensing components comprises a bleeder circuit formed by connecting two strain sensing resistors connected in series;
   one of the sensing components comprises a shunt circuit formed by a strain sensing resistor and a reference resistor connected in parallel;
   one of the sensing components comprises a shunt circuit formed by connecting two strain sensing resistors connected in parallel;
   one of the sensing components comprises a Wheatstone bridge formed by electrically connecting a strain sensing resistor with three reference resistors;
   one of the sensing components comprises a half-bridge circuit formed by electrically connecting two strain sensing resistors with two reference resistors;
   one of the sensing components comprises a full-bridge circuit formed by electrically connecting four strain sensing resistors; or
   one of the sensing components comprises a bridge circuit formed by electrically connecting three strain sensing resistors with a reference resistor.

10. The pressure sensing device according to claim 9, wherein the sensing component further comprises a temperature detection element, the temperature detection element being configured for detecting a temperature where the temperature detection element is located and outputting a temperature detection signal.

11. The pressure sensing device according to claim 9, wherein the signal measurement circuit further comprises an amplification circuit connected to the sensing component and configured for amplifying a signal output by the sensing component.

12. The pressure sensing device according to claim 11, wherein the signal measurement circuit further comprises a compensation circuit, an input terminal of the compensation circuit is coupled with an output terminal of the amplification circuit, and the compensation circuit is configured for compensating an out-of-balance voltage output from the sensing component according to a signal output by the amplification circuit.

13. A pressure sensing apparatus comprising a control panel, further comprising a pressure sensing device comprising:
at least one pressure sensing sheet, and
a first substrate, configured for carrying the at least one pressure sensing sheet:
wherein the pressure sensing sheet is connected with the first substrate by welding, and welding points are configured for transmitting a deformation and transmitting an electrical signal, and the at least one pressure sensing sheet comprises:
a second substrate, provided with an upper surface and a lower surface opposite to the upper surface;
at least one semiconductor film, disposed at the lower surface and/or the upper surface of the second substrate, wherein a signal measurement circuit is integrated in the at least one semiconductor film, and the signal measurement circuit is configured for detecting an amount of the deformation and outputting the electrical signal that is able to be identified; and
a plurality of bonding pads, configured to be welded with the first substrate, wherein the bonding pads are arranged at the upper surface of the second substrate, and are electrically connected to the semiconductor film; and
wherein the pressure sensing device is pasted at an inner surface of the control panel, and the pressure sensing device deforms following of the control panel.

14. The pressure sensing apparatus according to claim 13, wherein the semiconductor film comprises at least one selected from the group consisting of a silicon film, a germanium film, a gallium arsenide film, a gallium nitride film, and a silicon carbide film, a zinc sulfide film, a zinc oxide film, and any combination thereof.

15. The pressure sensing apparatus according to claim 13, wherein a thickness of the semiconductor film is n<70 μm, or n<50 μm, or n<30 μm, or n<25 μm, or n<20 μm, or n<15 μm, or n<10 μm.

16. The pressure sensing apparatus according to claim 13, wherein the first substrate is a flexible printed circuit, a printed circuit board, a metal substrate or a ceramic substrate.

17. The pressure sensing apparatus according to claim 13, wherein the plurality of bonding pads are arranged along a periphery of the upper surface of the second substrate.

18. The pressure sensing apparatus according to claim 13, wherein the second substrate is a glass plate, a ceramic plate, a PCB board, an aluminum substrate, or a silicon wafer.

19. The pressure sensing apparatus according to claim 13, wherein at least two semiconductor films are provided, and at least one of the semiconductor films is disposed at the lower surface of the second substrate, and the other semiconductor films are disposed at the upper surface of the second substrate, and the semiconductor films are distributed to be adjacent to each other.

20. A pressure sensing apparatus comprising a control panel and a control circuit board pasted at an inner surface of the control panel and configured for controlling the control panel, wherein further comprising a pressure sensing device comprising:
at least one pressure sensing sheet, and
a first substrate, configured for carrying the at least one pressure sensing sheet;
wherein the pressure sensing sheet is connected with the first substrate by welding, and welding points are configured for transmitting a deformation and transmitting an electrical signal, and the at least one pressure sensing sheet comprises:
a second substrate, provided with an upper surface and a lower surface opposite to the upper surface;
at least one semiconductor film, disposed at the lower surface and/or the upper surface of the second substrate, wherein a signal measurement circuit is integrated in the at least one semiconductor film, and the signal measurement circuit is configured for detecting an amount of the deformation and outputting the electrical signal that is able to be identified; and
a plurality of bonding pads, configured to be welded with the first substrate, wherein the bonding pads are arranged at the upper surface of the second substrate, and are electrically connected to the semiconductor film; and
wherein the first substrate of the pressure sensing device is the control panel control circuit board, and the second substrate of the pressure sensing device deforms following the control circuit board of the control panel.

* * * * *